(12) United States Patent
El-Zein et al.

(10) Patent No.: US 10,599,804 B1
(45) Date of Patent: Mar. 24, 2020

(54) PIN CLONING AND SUBWAY CREATION ON AUTOMATICALLY GENERATED DESIGN PHYSICAL HIERARCHY

(71) Applicant: International Business Machines Corporation, Armonk, NY (US)

(72) Inventors: Ali S. El-Zein, Austin, TX (US); Robert J. Shadowen, Austin, TX (US); Alvan W. Ng, Austin, TX (US); Clay C. Smith, Austin, TX (US); Wolfgang Roesner, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/177,560

(22) Filed: Nov. 1, 2018

(51) Int. Cl.
*G06F 17/50* (2006.01)

(52) U.S. Cl.
CPC ........ *G06F 17/505* (2013.01); *G06F 17/5072* (2013.01); *G06F 17/5081* (2013.01)

(58) Field of Classification Search
CPC . G06F 17/505; G06F 17/5072; G06F 17/5081
USPC ........................................................ 716/104
See application file for complete search history.

(56) References Cited

U.S. PATENT DOCUMENTS

| | | | |
|---|---|---|---|
| 8,104,014 B2 | 1/2012 | Puri et al. | |
| 8,413,104 B2 | 4/2013 | Ellavsky et al. | |
| 8,566,059 B2 * | 10/2013 | Desineni | G06F 11/261 |
| | | | 702/117 |
| 9,201,999 B1 * | 12/2015 | Sahni | G06F 17/5072 |
| 9,449,127 B1 * | 9/2016 | Mishra | G06F 17/5031 |
| 2005/0125758 A1 | 6/2005 | Lembach et al. | |
| 2017/0300601 A1 * | 10/2017 | Viswanath | G06F 17/5072 |
| 2018/0165405 A1 * | 6/2018 | Braun | G06F 17/5081 |

OTHER PUBLICATIONS

Chen, F. & Li, R. (2013). Sink Node Placement Strategies for Wireless Sensor Network. Wireless Pers. Commun, 68 (303-319). DOI: 10.1007/s11277-011-0453-x.

* cited by examiner

*Primary Examiner* — Suresh Memula
(74) *Attorney, Agent, or Firm* — Patterson + Sheridan, LLP (57) ABSTRACT

Method and apparatus for managing connections within a netlist include using a clone module to the connections between different components within the netlist. A buffer may be inserted between components of a netlist to split a connection into multiple segments and then moved into an associated first instance. The inclusion of the buffer allows for one or more of pin cloning and subway utilization to occur when mapping between a functional hierarchy to a physical hierarchy is performed.

20 Claims, 5 Drawing Sheets

PIN CLONING AND SUBWAY CREATION ON AUTOMATICALLY GENERATED DESIGN PHYSICAL HIERARCHY

BACKGROUND

The present invention relates to managing routings within a netlist, and more specifically to using buffers to manipulate signals within a netlist.

Hardware designs are typically hierarchical and modularity may be achieved by encapsulating logic functionality as a node in a design hierarchy. However, the functional hierarchy may not map to a two dimensional layout solution as the functional hierarchy typically does not consider of layout information, such as area and routing constraints. Further, due to strict enforcement of a single functional and physical hierarchy mapping, logic designs, and verification are less efficient. Further, design processes using hardware description language (HDL) are commonly constrained by physical constraints, and in many instances, automatically mapping functional hierarchy to physical hierarchy has failed to the difficulty in performing pin optimization, pin cloning, subway specifying, and connection routing. Thus, techniques that are able to utilize pin cloning and subway creation may make it possible to employ automatic mapping from a functional hierarchy into a physical hierarchy.

SUMMARY

According to one embodiment of the present invention, a method of managing connections of a netlist comprises inserting a buffer between a source and a sink netlist and moving the buffer into a hierarchical instance altering a hierarchy of the buffer from a first level to a second level different than the first level. Inserting the buffer includes segmenting a connection between the source and sink into a first segment and a second segment, and moving the buffer into a hierarchical instance altering a hierarchy of the buffer from a first level to a second level different than the first level.

Another embodiment of the present invention is a computer program product that includes computer-readable program code executable to perform an operation that includes inserting a buffer between a source and a sink of a netlist and moving the buffer into a hierarchical instance altering a hierarchy of the buffer from a first level to a second level different than the first level. Inserting the buffer includes segmenting a connection between the source and sink into a first segment and a second segment, and moving the buffer into a hierarchical instance altering a hierarchy of the buffer from a first level to a second level different than the first level.

Another embodiment of the present invention is a computing system that includes a computing processor and a memory comprising a program that when executed by the processor is configured to insert a buffer between a source and a sink of a netlist by and move the buffer into a hierarchical instance altering a hierarchy of the buffer from a first level to a second level different than the first level. Inserting the buffer includes segmenting a connection between the source and sink into a first segment and a second segment, and moving the buffer into a hierarchical instance altering a hierarchy of the buffer from a first level to a second level different than the first level.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein generate connections for a logic design hierarchy in instances where the logic design hierarchy specifies connections that are not logically required. Pin cloning and subways may be employed to generate the connections through the use of buffers. In one embodiment, a buffer is inserted within a signal, and then moved across a hierarchy boundary to be placed within a corresponding instance. For example, a buffer may be inserted between a logical source of a hierarchical instance and a node, and then moved within the logical source such that when pin optimization is performed, a pin is created for both the logical source and the buffer. Further, the buffer may be inserted between a first and second instance, and the moved within a third instance that is located between the first and second instance, creating a subway and one or more corresponding ports within the third instance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Figure 1:
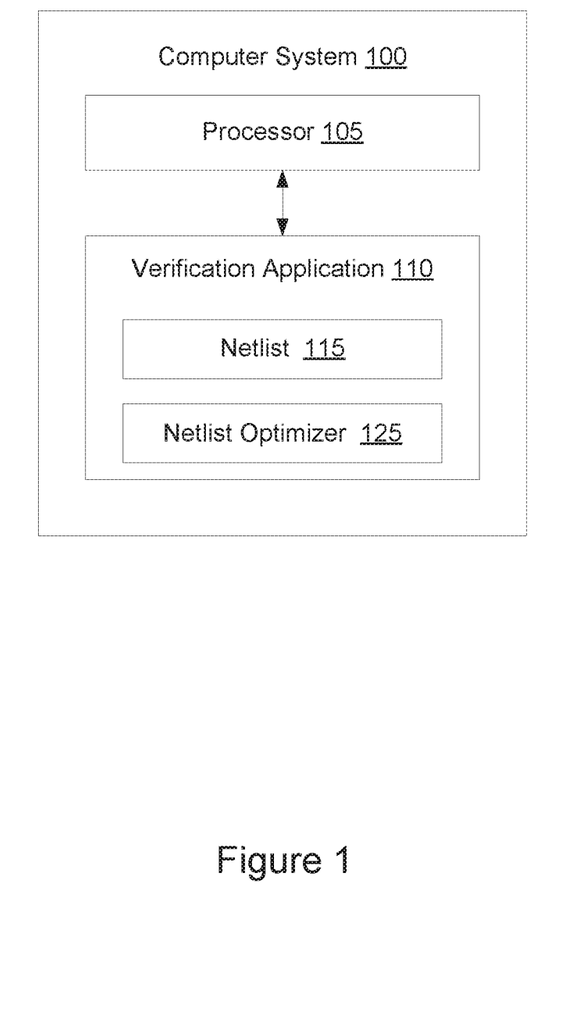
FIG. 1 illustrates a computing system for managing connections a netlist, according to one embodiment described herein.

FIG. 1 illustrates a computing system 100 for optimizing connections in a netlist 115 being verified, according to one embodiment described herein. The computing system 100 includes a processor 105 and a verification application 110. The processor 105 represents one or more processing elements that each may include multiple processing cores. Using the processor 105, the verification application 110 can evaluate the netlist 115 to perform hierarchical remapping. In one embodiment, the verification application 110 automatically converts the functional hierarchy of the netlist to a physical hierarchy. Specifically, the verification application 110 includes a netlist optimizer 125 which is configured to perform pin optimization, pin cloning, subway generation, and connection routing within of netlist 115. As described in more detail below, buffers may be inserted within nets of a netlist to reroute signals, and the netlist optimizer 125 may be utilized for pin cloning and subway creation.

In one or more embodiments, buffers may be referred to as clone modules. In various embodiments, a buffer may be used to manipulate a connection between components in a netlist. For example, a buffer may be inserted along a connection between two components, splitting the connection and corresponding signal into two segments. In various embodiments, the buffer is a sink of the netlist. In one or more embodiments, the buffer is a user defined proto. In one embodiment, the buffer is a user defined proto and may be recognized as a subway buffer and during the physical mapping the subway buffer may be retained. Further, the subway buffer may be removed during the physical design of the corresponding integrated circuit, and the corresponding wires joined. In one or more embodiments, the buffer or buffers may be dissolved.

In one embodiment, a buffer is an instance which splits a connection into two segments but passes the same logic value through, so the logic function is not affected by buffer insertion. For example, with reference to FIGS. 4A-4C, the signals 455 and 465 are part of two different nets as signal 455 has been split by buffer 460. However, if buffer 460 was removed then the 2 pins would be connected to the same net and the port would be optimized back to FIG. 4A as it would be redundant.

The netlist 115 may include one or more nets (or networks), and each net may be two or more interconnected components. For example, a net may be a mapping between a logical source of an instance and a sink. An instance may be one of an entity, module, proto and a cell. In various embodiments, the design hierarchy is defined in terms of logic pieces (e.g., entities, modules, protos and/or cells). Further, the design hierarchy defines the logic content/function and associated input/output pins the instantiations of the entities modules, and/or protos. In one embodiment, an instantiation of a proto is located within a parent proto, and has connections of the instance pins to signals in the parent proto. Further, an instance may be an instance of a user defined proto. Alternatively, an instance may be primitive circuit element such as a resistor, logic gate, or the like.

In one or more embodiments, pin cloning refers to a signal that crosses a hierarchy through multiple pins. In one embodiment, a subway (or a pass-through) is a connection that passes through an instance without having any sinks or logic sources within the instance. In one embodiment, pin cloning replicates one or more sections of a two dimensional (2D) layout, and positions the replicated sections at more than one location within the 2D layout. Further, each of the replicated sections preserves the hierarchical structure of the design. For example, a cloned pin corresponds to a section of the 2D layout that is a replicated from another pin of the 2D layout.

Although the embodiments herein describe the netlist 115 as detailing a design for a hardware component (e.g., a processor, ASIC, memory unit, floating point unit, etc.), the techniques described herein may also be used to verify software applications. In one embodiment, the netlist 115 includes signals having instances and nodes. Moreover, in one embodiment, the netlist 115 is a sequential netlist (i.e., a state-saving netlist) that includes sequential hardware elements (i.e., latches and registers) and/or memory arrays.

The verification application 110 may be configured to map a functional hierarchy to a 2D physical layout. The 2D physical layout may be used in the manufacturing process to fabricate a physical integrated circuit (IC). In one embodiment, automatic mapping may be used to map the functional hierarchy to the 2D physical layout. The functional hierarchy may correspond to a functionally grouping of components where components that are functionally related to each other are grouped close to each other within the 2D physical layout and/or in the IC. In one embodiment, the verification application 110 maps the functional hierarchy to a physical hierarchy before generating the 2D physical layout. The physical hierarchy may refer to a mapping of components according to geographic proximity within the 2D physical layout and/or in.

Figure 2:
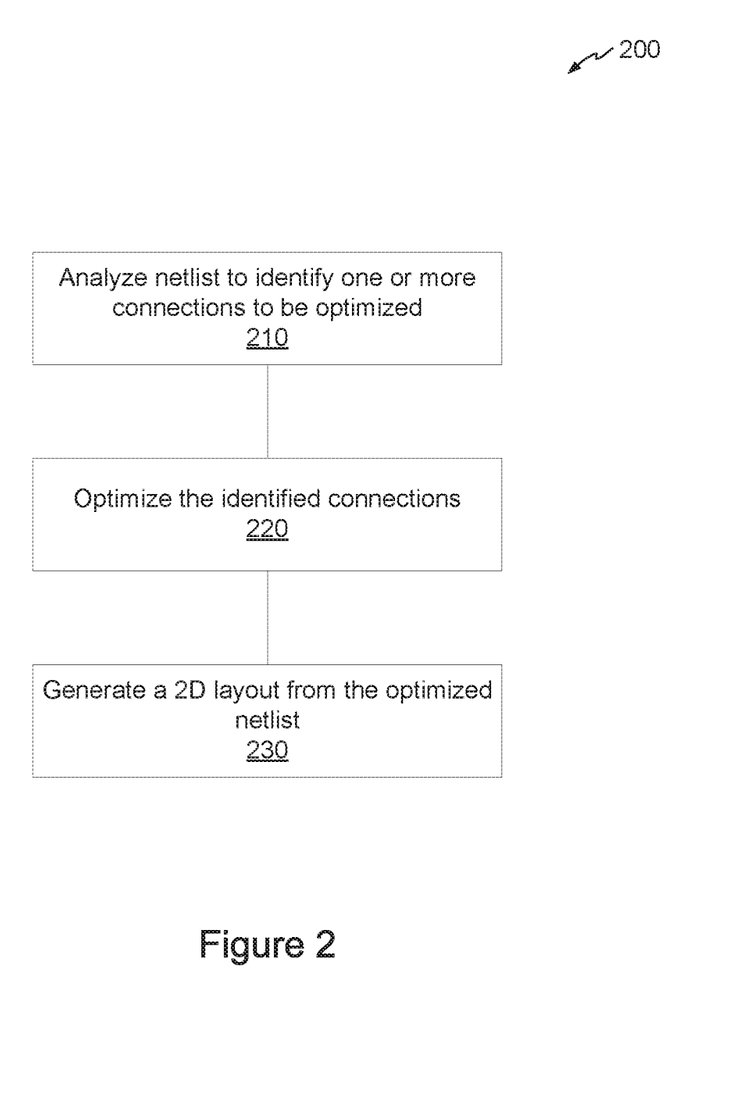
FIG. 2 is a flow chart system for optimizing a netlist, according to one embodiment described herein.
Figure 4A:
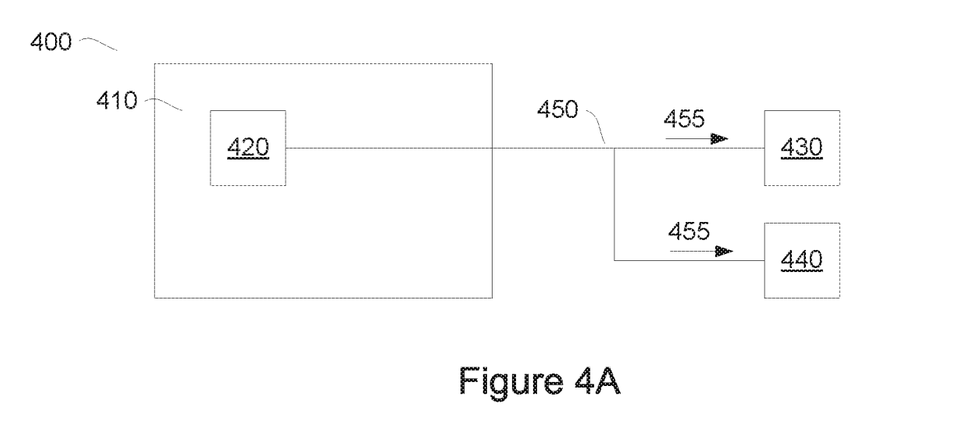
FIGS. 4A, 4B, and 4C illustrate the use of buffers for managing connections of a a netlist, according to one embodiment described herein.
Figure 4B:
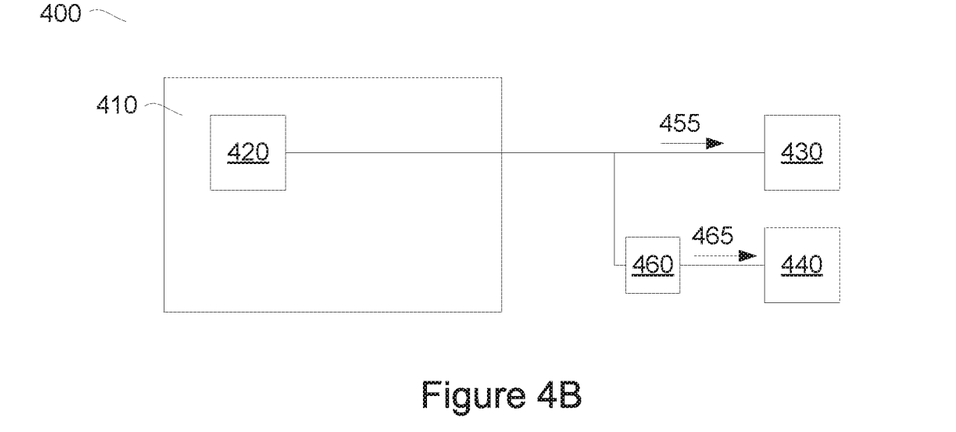
Figure 4C:
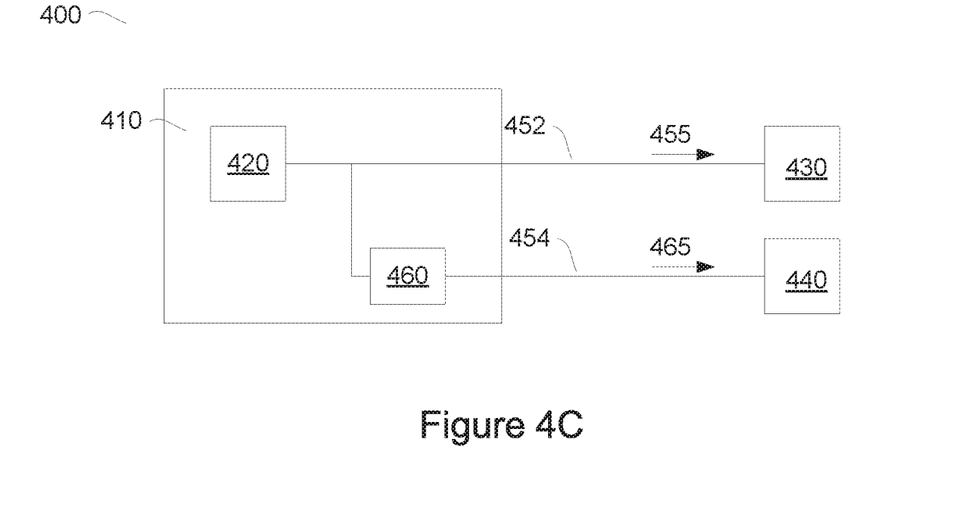

FIG. 2 illustrates method 200 for generating the 2D physical layout. At step 210 of method 200 a netlist is analyzed to identify one or more connections to be optimized by increasing the efficiency of the connections. For example, the connections between components may be rerouted for increased efficiency. In one embodiment, the verification application 110 identifies one or more connections to be processed via pin cloning and/or one or more connections to be processed via subway creation to increase the efficiency of the connections. In one embodiment, a more efficient connection is one that is shorter in length and/or corresponds to a dedicated pin. In one or more embodiments, pin (or port) optimization minimizes the number of input/output pins. For example, this may include joining nets, but not instances, and removing any subsequently unused pins. With reference to FIG. 4C, if buffer 460 was removed, performing port optimization would result in embodiment of FIG. 4A. As such, the process shown in FIG. 4A through FIG. 4C and corresponding description illustrate a method for "overriding" port optimization, as the buffer 460 in FIG. 4C prevents the 2 pins from being optimized back into 1 pin.

Figure 5A:
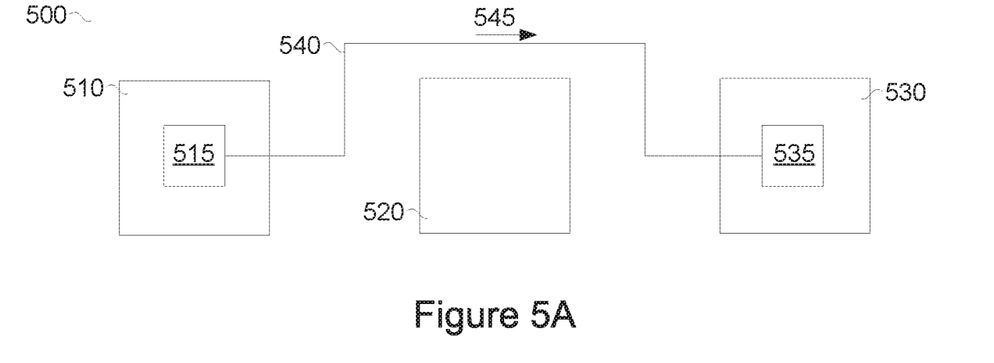
FIGS. 5A, 5B, and 5C illustrate the use of buffers for managing connections of a a netlist, according to one embodiment described herein.
Figure 5B:
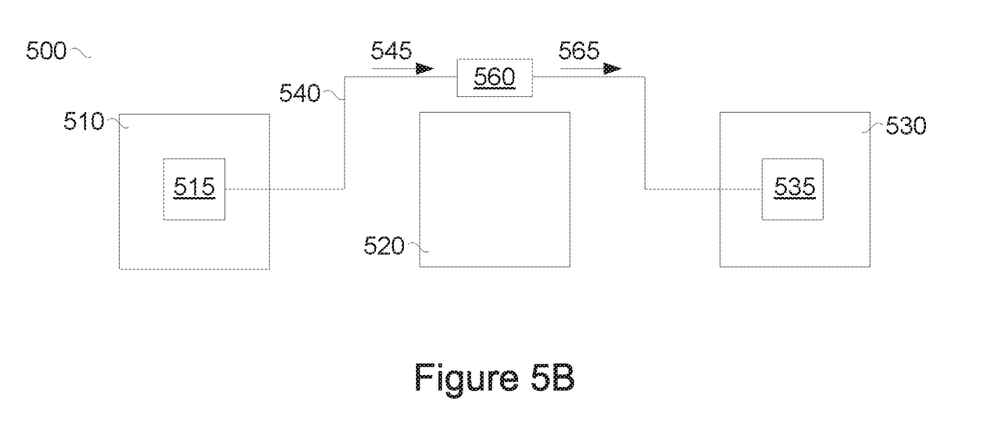

Identifying connections to be processed via pin cloning includes identifying a connection between a first component and at least two other components, where a common signal is communicated from the first component to the two other components. For example, netlist 400 of FIG. 4A is indicative of a connection that is to be processed via pin cloning, as signal 455 travels from logical source 420 to both sinks 430 and 440. Further, identifying connections to be processed via subway creation may include identifying a connection between two components that, when routed through another component, the connection is determined to be more efficient. For example, FIG. 5A illustrates a connection that is to be processed via subway creation, as connection 540 travels around instance 520 and a more efficient connection (e.g., a connection of shorter length) would be through instance 520.

At step 220 of method 200, the identified connections are optimized. For example, the verification application 110 is configured to perform pin cloning and subway creation on the identified connections to improve the efficiency of the connections. These two optimization techniques are discussed in more detail below.

At step 230 of method 200, a 2D layout is generated from the optimized netlist. In one embodiment, the 2D layout may be an electronic circuit layout for an electronic device. The verification application 110 may be configured to minimize the number of pins by removing unnecessary ports and by collapsing pins which carry redundant signals (e.g., have redundant connections) when generating the 2D layout. In one embodiment, a buffer is not considered to be a redundant port, and in that case, the verification application 110 retains the pin and connection from the buffer when mapping the functional hierarchy to the physical hierarchy. In one embodiment, a redundant port (or pin) is connected to the same netlist.

For example, the verification application 110 maps the functional hierarchy (examples of which are shown in FIGS. 3C and 4C) into a physical hierarchy. The netlist optimizer 125 performs port optimization on netlist 400, and as the pins corresponding to logic source 420 and buffer 460 are not redundant, and both pins are retained within the 2D layout when the physical hierarchy is generated from the functional hierarchy. In one embodiment, buffers 460 and 560 are converted to a hardware description language (HDL) statement when mapping to a physical hierarchy is performed.

Figure 3A:
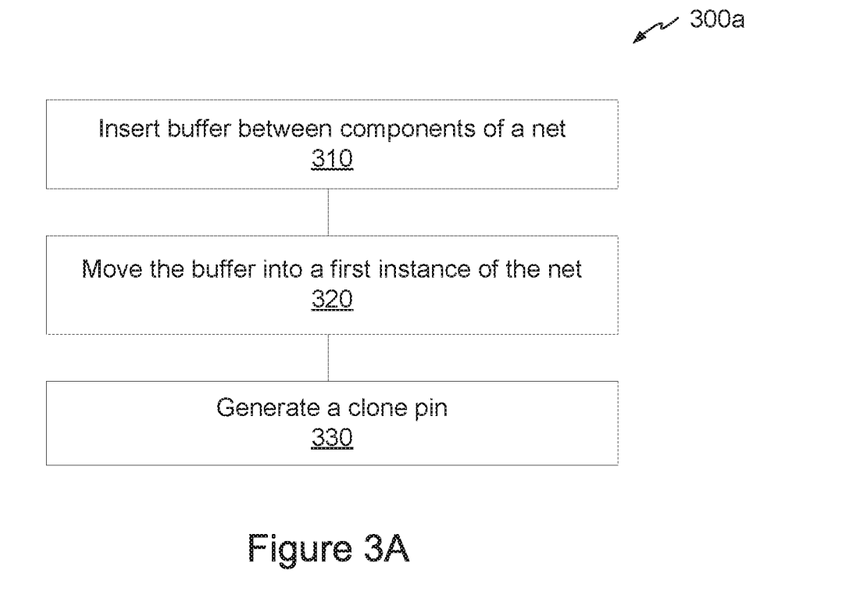
FIGS. 3A and 3B depict methods for managing connections within a netlist, according to one embodiment described herein.

FIG. 3A illustrates method 300a for optimizing connections within a netlist, such as the netlist 115, by generating a cloned pin. The method 300a is described with regards to netlist 400 of FIGS. 4A-4C. For example, with reference to FIG. 4A, netlist 400 includes instance 410, logic source 420, sinks 430 and 440, and connection 450. Further, a signal 455 is communicated from logic source 420 to both sinks 430 and 440 along the connection 450. Instance 410 may be a hierarchical instance. As can be seen from the embodiment of FIG. 4A, the same signal, signal 455, is communicated to both sinks 430 and 440 from logic source 420.

At step 310 a buffer is inserted between components of a netlist. With reference to FIG. 4B, a buffer 460 is inserted along connection 450 and between logic source 420 and sink 440. Inserting the buffer 460 as described configures the sink 440 to receive signal 465 which passes from logical source 420 and through buffer 460. In one embodiment, connection 450 is segmented into two segments, connection 454 and 452 and buffer 460 is inserted between two segments (e.g., between connection 454 and 452).

The buffer may be a user specified entity. Further, the buffer may be a library cell or an assignment buffer, which may be converted by the verification application 110 into an assignment statement in the output logical hierarchy. Further, the buffer may be inserted via a clone command. Further, the buffer may be configured to replicate a signal, such that the signal received by the buffer is the same signal output by the buffer. Further, the buffer is a unique instance which can be mapped when going from a functional hierarchy to a 2D physical layout. In various embodiments, the buffer is a sink of the netlist.

At step 320, the buffer is moved into a hierarchical instance of the netlist. For example, with reference to FIG. 4C, buffer 460 is moved into instance 410. Buffer 460 is unique from logic source 420, and when the buffer 460 is moved into instance 410 and pin cloning is performed, a pin is associated with both connection 454 and 452.

At step 330 of method 300, a clone pin is generated such that a pin is generated for both connections 452 and 454. For example, when the 2D layout is generated from a netlist having netlist 400, the layout will include a pin corresponding to both connections 452 and 454, where the pin corresponding to connection 454 and buffer 460 is replicated from the pin corresponding to logic source 420 and connection 452. In one embodiment, instance 410 is an integrated circuit, and the 2D layout generated from netlist 400 will include a pin corresponding to both connections 452 and 454. Further, the 2D physical layout may be generated by performing an automatic mapping function on netlist 400. In one embodiment, as buffer 460 is a unique instance, the buffer 460 may be mapped when going from a functional hierarchy to a 2D physical layout. In one embodiment, automatic mapping refers to a software system that converts a netlist into a 2D physical layout, where each proto is replaced with a corresponding 2D layout of an integrated circuit, and signals are replaced by wires. For example, in the case of pin cloning, the pins will typically be on different edges of the 2D layout of the integrated circuit depending on the direction the wires.

Figure 3B:
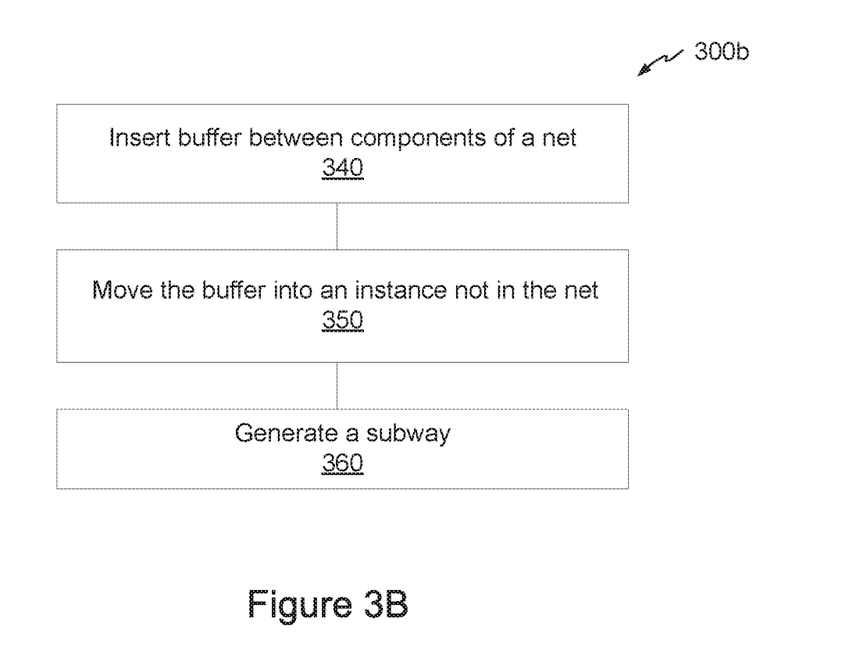

FIG. 3B illustrates method 300b for optimizing connections within a netlist, such as the netlist 115, by generating a subway connection. In one embodiment, with reference to FIG. 5A, a netlist 500 includes instances 510, and 530, logic source 515, sink 535 and connection 540. Further, a signal 545 is communicated from logic source 515 to sink 535 along connection 540 which bypasses the instance 520. Instance 520 may be a hierarchical instance that is not part of the netlist 500. In various embodiments, instances 510 and 530 are hierarchical instances that are part of the netlist 500.

At step 340 of method 300b, the buffer is inserted between components of a netlist, for example, connection 540. In one embodiment, connection 540 is segmented into two segments and the buffer 560 is inserted between the two segments of connection 540 and between the instance 510 and the sink 535. Additionally, signal 545 is segmented into signals 545 and 565. The buffer 560 is configured to receive signal 545 and output signal 565. In one or more embodiments, signal 565 may be a copy of signal 545.

At step 350 a buffer is moved into a component (e.g., the hierarchical instance) of that not included in the netlist. For example, buffer 560 is moved into instance 520. Moving the buffer 560 into the instance forms a path that travels through the instance 520 instead of around instance 520, improving the efficiency of the corresponding connection. Further, at step 360 a subway is generated. For example, when the 2D layout is generated from a netlist having netlist 500, buffer 560 is identified as being a unique instance not having logic sink or source within the instance 520, thus a subway connection through instance 520 is generated. Further, as the buffer 560 is a unique instance, the buffer 560 is mapped when going from a functional hierarchy to a 2D physical layout.

In one embodiment, both pin cloning and subway creation may be applied to the same netlist. Further, in one or more embodiment, verification application 110 may be configured to perform automatic mapping when generating the physical layout from the functional layout.

In one embodiment, moving a buffer (e.g., buffer 460 or buffer 560) into a hierarchical instance (e.g., instance 410 or instance 520) alters the hierarchy of the buffer. In one embodiment, altering the hierarchy of a buffer corresponds to moving the buffer between different levels of a design hierarchy. For example, the buffer may be moved from a lowest level of a design hierarchy to a higher level. In one embodiment, the design hierarchy may include a basic cell level (e.g., lowest level), a level cell level and building block level (e.g., highest level). Basic cells may comprise an aggregation of circuit elements, such as a collection of logic gates, and may be thought of as residing at the bottom of the design hierarchy. Basic cells may be nested together, along with other circuit elements, to form level cells at different mid-levels within the design hierarchy. The level cells may be further nested together to form building blocks. Building blocks may be thought of as residing at the top of the design hierarchy. In one embodiment, altering the hierarchy of a buffer correspond to moving the buffer between different levels of a design hierarchy.

Figure 5C:
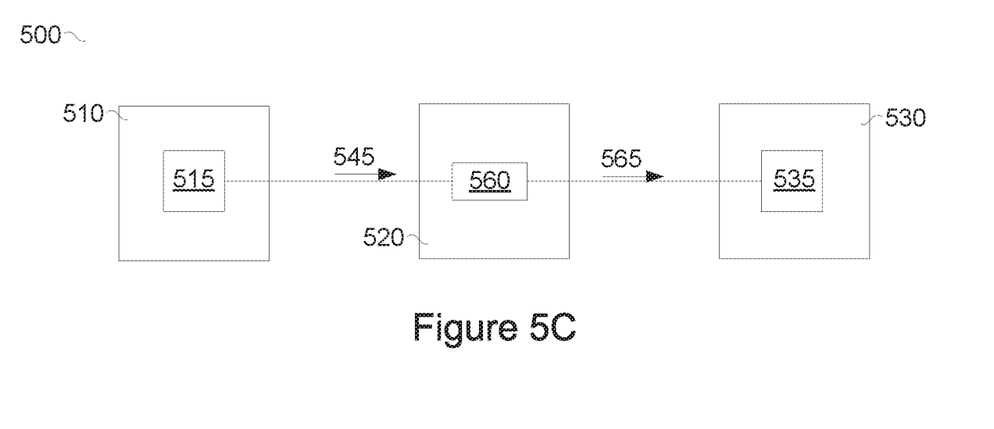

In the embodiments where buffer 460 is moved into instance 410, the hierarchy of buffer 460 corresponds to that of instance 410. Further, in the embodiments where buffer 560 is moved into instance 520, the hierarchy of buffer 560 corresponds to that of instance 520. For example; when moving a buffer (e.g., buffer 460 or 560) into an instance (e.g., instance 410 or 520) the buffer may be moved from a lowest level of a design hierarchy to the highest level.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A system comprising:
a processor; and
a storage device comprising computer-readable program code when executed by the processor comprises:
inserting a buffer between a source and a sink of a netlist by:
segmenting a connection between the source and sink into a first segment and a second segment, and
inserting the buffer between the first segment and the second segment; and
moving the buffer into a hierarchical instance altering a hierarchy of the buffer from a first level to a second level different than the first level.

2. The system of claim 1, wherein the source is within the hierarchical instance and connected to a second sink.

3. The system of claim 2, wherein inserting the buffer is configured to communicate a signal received from the source to the sink.

4. The system of claim 2, wherein the buffer is non-redundant with the source, and performing a mapping from a functional hierarchy of the netlist to a physical hierarchy retains a pin of the buffer and a pin of the source.

5. The system of claim 1, wherein the hierarchical instance is not part of a connection of the netlist, and the hierarchical instance is between the source and the sink.

6. The system of claim 5, wherein performing a mapping from a functional hierarchy of the netlist to a physical hierarchy generates a subway within the hierarchical instance, the subway lacking a sink or logical source within the hierarchical instance.

7. A method of managing connections within a netlist, the method comprising:
inserting a buffer between a source and a sink of the netlist by:
segmenting a connection between the source and sink into a first segment and a second segment, and
inserting the buffer between the first segment and the second segment; and
moving the buffer into a hierarchical instance altering a hierarchy of the buffer from a first level to a second level different than the first level.

8. The method of claim 7, wherein the buffer is a sink of the netlist.

9. The method of claim 7, wherein hierarchical instance is part of a connection of the netlist, and wherein the source is within the hierarchical instance and connected to a second sink.

10. The method of claim 9, wherein the buffer is configured to communicate a signal received from the source to the sink.

11. The method of claim 9, wherein the buffer is non-redundant with the source, and performing a mapping from a functional hierarchy of the netlist to a physical hierarchy retains a pin of the buffer and a pin of the source.

12. The method of claim 7, wherein the hierarchical instance is not part of a connection of the netlist, and the hierarchical instance is between the source and the sink.

13. The method of claim 12, wherein performing a mapping from a functional hierarchy of the netlist to a physical hierarchy generates a subway within the hierarchical instance, the subway lacking a sink or logical source within the hierarchical instance.

14. A computer program product for analyzing an electrical circuit, the computer program product comprising:
a computer-readable storage medium having computer-readable program code embodied therewith, the computer-readable program code executable by one or more computer processors to:
insert a buffer between a source and a sink of a netlist by:
segment a connection between the source and sink into a first segment and a second segment, and
insert the buffer between the first segment and the second segment; and
move the buffer into a hierarchical instance altering a hierarchy of the buffer from a first level to a second level different than the first level.

15. The computer program product of claim 14, wherein the buffer is a sink.

16. The computer program product of claim 14, wherein the source is within the hierarchical instance and connected to a second sink.

17. The computer program product of claim 16, wherein inserting the buffer is configured to communicate a signal received from the source to the sink.

18. The computer program product of claim 16, wherein the buffer is non-redundant with the source, and performing a mapping from a functional hierarchy of the netlist to a physical hierarchy retains a pin of the buffer and a pin of the source.

19. The computer program product of claim 14, wherein the hierarchical instance is not part of a connection of the netlist, and the hierarchical instance is between the source and the sink.

20. The computer program product of claim 14, wherein performing a mapping from a functional hierarchy of the netlist to a physical hierarchy generates a subway within the hierarchical instance, the subway lacking a sink or logical source within the hierarchical instance.

* * * * *